United States Patent
Bien

[19]

[11] Patent Number: 5,929,710
[45] Date of Patent: Jul. 27, 1999

[54] CASCODE SINGLE-ENDED TO DIFFERENTIAL CONVERTER

[75] Inventor: David E. Bien, Tucson, Ariz.

[73] Assignee: National Semiconductor Corporation, Santa Clara, Calif.

[21] Appl. No.: 08/822,377

[22] Filed: Mar. 20, 1997

[51] Int. Cl.$^6$ ................................. H03F 3/04; H04B 1/28
[52] U.S. Cl. ........................ 330/301; 330/311; 455/333
[58] Field of Search ............................ 330/73, 148, 275, 330/301, 311; 455/326, 333

[56] References Cited

U.S. PATENT DOCUMENTS

| | | | |
|---|---|---|---|
| 2,830,133 | 4/1958 | Ranks ......................................... | 330/73 |
| 4,001,706 | 1/1977 | Prins et al. .......................... | 330/301 X |
| 4,956,615 | 9/1990 | Bohme et al. ....................... | 330/301 X |
| 5,497,123 | 3/1996 | Main et al. .............................. | 330/257 |

OTHER PUBLICATIONS

Durec et al., "Motorola's Mosaic V Silicon Bipolar RF Building Blocks Fill Gaps in High Performance, Low Power Wireless Chips" *Wireless Symposium*, 1996, pp. 218–219.

*Primary Examiner*—James B. Mullins
*Attorney, Agent, or Firm*—Skjerven, Morrill, MacPherson, Franklin & Friel LLP; Norman R. Klivans

[57] ABSTRACT

A cascode single-ended to differential converter has particular applications for use in communication, e.g. RF circuits. The converter provides higher gain, reduced noise figure and improved output level and linearity over the prior art differential pair converter. The present converter is a transconductor, converting an input voltage to a differential current output signal, i.e., two output signals of different currents, with the difference being linear to the level of voltage. The cascode amplifier output signal is used to produce a signal equal in the amplitude but 180 degrees out of phase with the signal produced by the cascode amplifier.

7 Claims, 2 Drawing Sheets

CASCODE SINGLE-ENDED TO DIFFERENTIAL CONVERTER

BACKGROUND OF THE INVENTION

1. Field of the Invention

This invention pertains to analog signal processing and more specifically to a circuit for conversion of a voltage to a differential current.

2. Description of the Related Art

Differential converters are well known; an example of such a converter using a standard differential pair of transistors Q1 and Q2 is shown in FIG. 1. An input signal ΔV is applied to the base of transistor Q1. The base of the second transistor Q2 is connected to AC ground. (DC ground is an absolute signal reference at zero volts potential, usually referred to as "ground" or "earth" in the literature. AC ground is a signal reference that may be at a potential other than zero volts. In practice, AC ground is a DC voltage source.) The emitters of transistor Q1 and Q2 are connected to a current sink $I_S$ which sinks a current of $2I_0$ where $I_0$ is the emitter current of each transistors Q1, Q2.

With this circuit it can be shown that $I_1-I_2=2I_0 (e^{\Delta V/2V_T}-e^{-\Delta V/2V_T})/(e^{\Delta V/2V_T}+e^{-\Delta V/2V_T})$. In this case, $V_T$ is the transistor thermal voltage of each of transistors Q1 and Q2 where they are identical transistors. $V_T=kT/q$ where k is Boltzman's constant, T is temperature in °K., and q is electronic charge. At room temperature, $V_T$ is about 26 mV.

Therefore, it follows that the small signal gain is equal to $I_0/V_T$ and the maximum output current is equal to $\pm 2I_0$. Hence undesirably, both the small signal gain and the maximum output current are limited.

It is to be appreciated that there are two output currents $I_1$ and $I_2$; hence this is referred to as a differential pair since the output signal is the difference $I_1-I_2$ between the currents which is a function of the voltage ΔV of the input signal.

As shown above, this function is not truly linear but is approximately linear. It is understood that the input signal ΔV, may be a sinusoidal signal as depicted, for instance an RF (radio frequency) signal.

FIG. 2 shows an improved converter (transconductance circuit) compared to that of FIG. 1. The circuit of FIG. 2 is disclosed in the publication "Motorola's Mosaic V Silicon Bipolar RF Building Blocks Fill Gaps in High Performance, Low Power Wireless Chips", by Durec et al., *Wireless Symposium*, 1996; see also U.S. Pat. No. 5,497,123 issued Mar. 5, 1996 to main and Durec. Present FIG. 2 is a redrawn version of FIG. 5 from that publication. The circuit of FIG. 2 includes a common base transistor Q4 and current mirror transistors Q5 and Q6 with transistor Q5 connected to function as a diode. When current flows through the input (which is a low impedance node formed at the junction of the emitter of Q4 and the collector base of Q5) the current adds to the quiescent current passing through the current mirror transistors Q5, Q6 and thus raising the input voltage. Resistors R1 and R2 may be used to improve the linearity of the circuit. As the input voltage rises, the current flowing through the common base transistor Q4 decreases. A signal flowing through the input of this circuit appears as a difference between two output currents I1, I2. Thus the circuit converts a single-ended input signal ΔV provided at the input terminal into a differential signal I1-I2. This publication also discloses use of this transconductance circuit in combination with a switch stage, to serve as a frequency mixer.

The FIG. 2 circuit, compared to that of FIG. 1, while being more linear has an inferior noise figure performance and an inferior gain. In this sense it is not a satisfactory solution to convert to current conversion.

Therefore there is still a need for a voltage to current converter providing a differential output current which is a linear function of the input voltage and having low noise and high gain.

SUMMARY

In accordance with this invention a cascode single-ended to differential converter converts single ended (unbalanced) signals to differential (balanced) output signals, resulting in high gain, low noise and improved output level and linearity. A signal is produced by the well known cascode amplifier configuration from the input signal. The output signal from the cascode amplifier is used to produce a corresponding signal equal in amplitude but 180° out of phase with the signal output by the cascode amplifier. By creating this out of phase signal, the circuit provides improved performance over the above-described converters. While the disclosed embodiment uses bipolar transistors, MOS transistors may be substituted, as will be apparent to one of ordinary skill in the art.

A converter in accordance with this invention includes in one embodiment four transistors. The input signal, which typically has a varying voltage level, is applied to the base (control) terminal of the first transistor, one current handling terminal of which is connected to the base terminal of a second transistor. The second current handling terminals of each of the first and second transistors are connected to ground. The base terminal of the third transistor is connected to a DC reference voltage, and its first current handling terminal provides a first output signal. The third transistor also has its base terminal connected to the DC reference voltage and the second output current is provided at its first current handling terminal, while its second current handling terminal is connected to the first current handling terminal of the second transistor. (For a bipolar transistor, the current handling terminals are the emitter and collector. For a field effect transistor, the control terminal is the gate, and the current handling terminals are the source and drain.) Thus a differential current output is provided at the first current handling terminals of the third and fourth transistors. With this circuit, the small signal gain is twice that of the standard differential pair and the maximum output current, unlike that of the standard differential pair, has no limit.

A small signal may be defined as any signal level for which the circuit behavior is not substantially changed from operation with an arbitrarily small signal. For instance, a common-emitter amplifier would exhibit the same gain for input signals of 1 μV, 10 μV, 100 μV, or 1 mV. Signal levels much above 100 mV, however, would probably create significant distortion and may disturb the operating point of the transistor. Such a condition would be considered large-signal operation. A rule of thumb for bipolar devices (transistors) is that signal swings less than $V_T=26$ mV are considered to be small-signal.

The present converter is useful, for instance, in a frequency converter or a mixer where the first and second output currents from the converter are switched by an associated switching stage.

DETAILED DESCRIPTION

Figure 2:
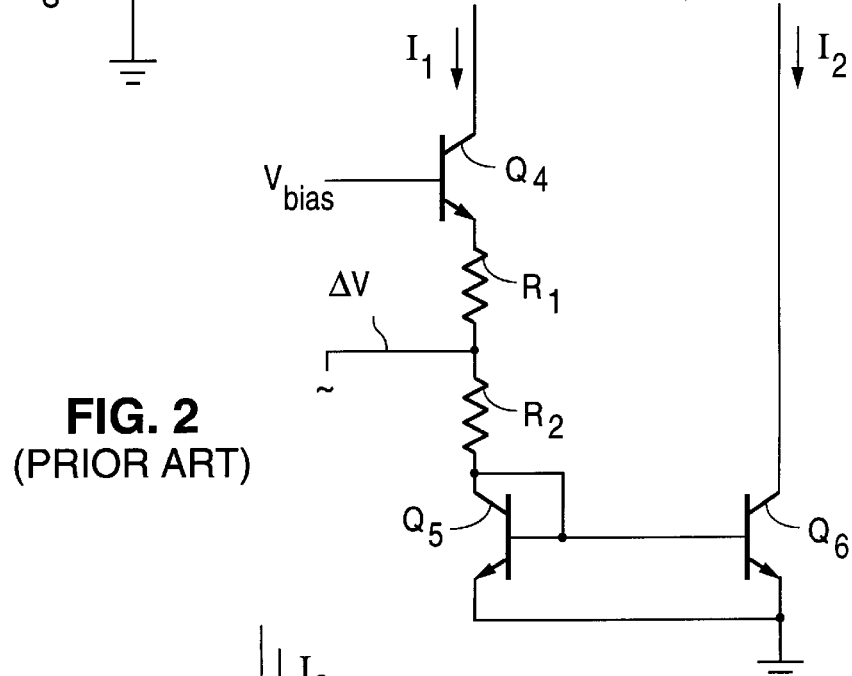
FIG. 2 shows an improved converter using three transistors.
Figure 3:
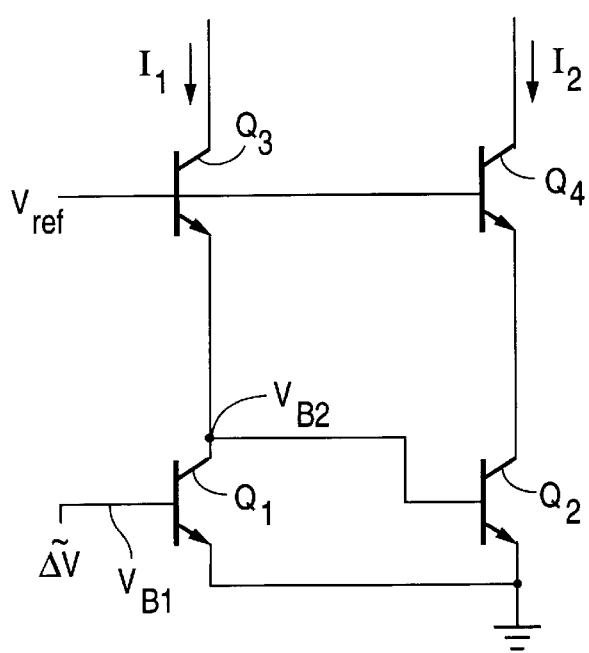
FIG. 3 shows a converter in accordance with this invention.

FIG. 3 shows a cascode single-ended to differential converter in accordance with the present invention. The transistor designations Q1, Q2, etc., in FIG. 3 do not to refer to similar numbered components in FIGS. 1 or 2.

The circuit of FIG. 3 includes four transistors. The input transistor Q1 has its base (control) terminal connected to the line supplying the input signal $\Delta V$. Two transistors Q3 and Q4 each have a base terminal connected to a reference voltage Vref. The output signals (currents) $I_1$ and $I_2$ are present at the collector terminals of transistors Q3 and Q4. The bias voltages $V_{ref}$ and $V_{B1}$ (which is the input signal) are initially chosen so that $V_{B1}$ is the DC bias voltage for the input. An AC signal will be superimposed on the DC bias such that:

$$V_{ref} = 2V_T ln(I_0/I_S)$$

and $$V_{B1} = V_T ln(I_0/I_S)$$

where $I_0$ is the emitter-collector current through each of transistors $Q_1$, $Q_2$ and $I_S$ is as defined below, so that $$V_{B2} = V_{ref} - V_{B1} = V_T ln(I_0/I_S) = V_{B1}$$

Then, $V_{B1}$ (the input signal) varies from its initial value by an amount $\Delta V$, which is the "swing" of the input signal so $$V_{B1} = V_T ln(I_0/I_S) + \Delta V$$

so that $$V_{B2} =$$
$$V_{ref} - V_{B1} = 2V_T ln(I_0/I_S) - V_T ln(I_0/I_S) - \Delta V = V_T ln(I_0/I_S) - \Delta V$$

Since $$I_2 = I_S e^{[V_T ln(I_0/I_S) - \Delta V]/V_T}$$
$$= I_0 e^{-\Delta V/V_T},$$

and $$I_1 = I_S e^{[V_T ln(I_0/I_S) - \Delta V]/V_T}$$
$$= I_0 e^{-\Delta V/V_T}$$

then $I_1 - I_2 = I_0[e^{-\Delta V/V_T} - e^{-\Delta V/V_T}]$, then the small signal gain=$2 I_0/V_T$, and the maximum output current has no limit. $V_{ref}$ will typically be set so that $I_1 = I_2$. Ideally, this occurs when $V_{ref} = 2 * V_{B1}$. $V_{ref}$ is a DC voltage that will not vary with an AC signal.

Figure 1:
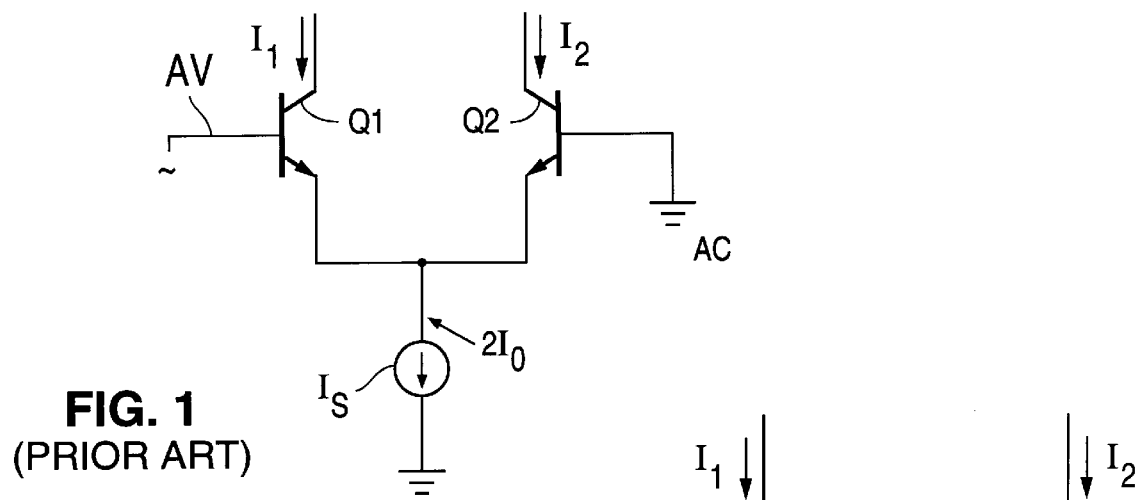
FIG. 1 shows a conventional differential pair used as a transconductor.

The circuit of FIG. 3 has the advantage over the above-described FIG. 1 and FIG. 2 converters of higher gain. Moreover, a higher output current is provided since the output currents $I_1$, $I_2$ are not inherently limited by bias conditions, as shown above. In other words, the FIG. 3 circuit provides higher output level and reduced distortion at higher signal levels.

Moreover, this provides a lower noise figure (less noise) than do the above-described converters; a higher gain without substantially increased noise means that the signal-to-noise ratio is better preserved or, in other words, there is a lower noise figure than with the standard differential pair of FIG. 2 under the same signal conditions.

Moreover, the Fig, 3 circuit provides low voltage operation because the DC voltage $V_{ref}$ applied to the bases of the cascode transistors Q3, Q4 is no higher than in the standard differential pair circuit, but because the cascode transistors have no significant signal imposed at their base terminals, they can be operated at a lower collector voltage without risk of saturation. Moreover reduced distortion is provided due to charging the parasitic capacitance of the converted source of the differential pair transistors $Q_1$, $Q_2$, which typically has the output capacitance of another transistor. Thus distortion and errors between the output currents $I_1$, $I_2$ are reduced.

Moreover, the circuit of FIG. 3 has high reverse isolation because the output signals $I_1$, $I_2$ couple through both a transistor collector-emitter path and at least one collector-base transistor path, so isolation is improved. This is especially beneficial in communication (RF) applications.

This FIG. 3 circuit has a high reverse isolation. Note that any voltage signals at the collectors of Q3 and Q4, such as may be present in subsequent circuits (not shown) that the output currents $I_1$ and $I_2$ provide input for, will not easily couple back to the input of this circuit. An AC voltage at the collector of transistor Q3 must couple back through the collector of transistor Q3 to its emitter and then from the collector of transistor Q1 to its base. An AC voltage at the collector of transistor Q4 must couple back to its emitter, then from the collector of transistor Q2 to its base, then finally from the collector of transistor Q1 to its base. Such coupling through multiple transistors, and particularly reserve coupling through transistors Q3 and Q4, greatly improves the isolation from the circuit output terminal back to the circuit input terminal.

Moreover, this circuit is well adapted to integrated circuits where component matching and scaling facilitate transistor biasing. Using integrated circuit technology, the circuit can constructed using transistors with nearly identical characteristics, because transistors are fabricated at the same time on the same wafer location and they are formed from the same process steps. Good device matching and scaling can be useful since this improves the matching of the differential output and can be used to provide biasing voltages needed to establish the circuit operating points. One possible biasing arrangement is shown in FIG. 4 (using components Q0, Q10, R3, R5, and R10).

While this description is of a circuit using bipolar transistors in FIG. 3, field effect transistors may be substituted therefor.

Figure 4:
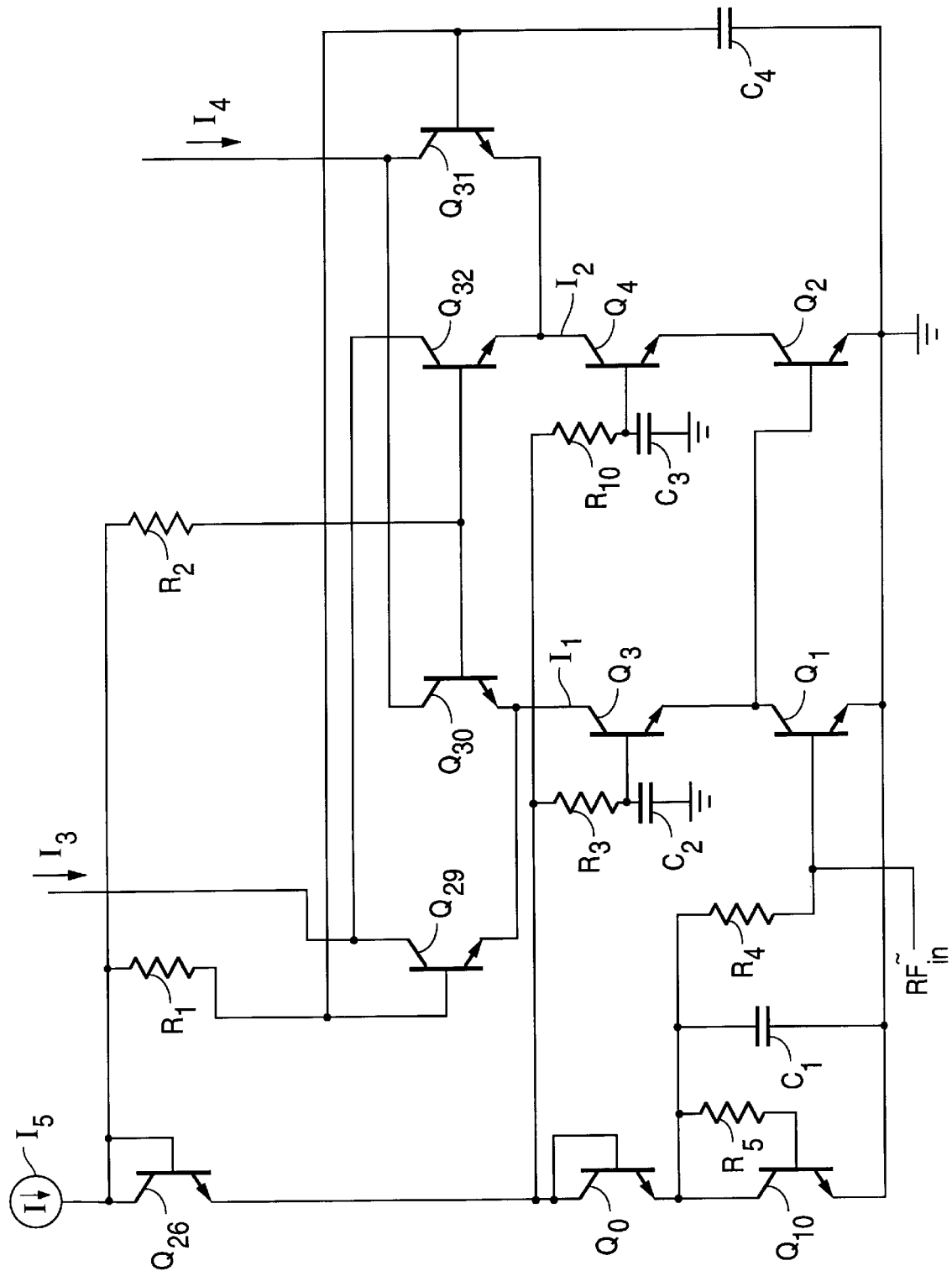
FIG. 4 shows that converter of FIG. 3 used in a frequency mixer.

FIG. 4 shows a frequency mixer circuit in accordance with this invention. The circuit is conventionally called a mixer because it accomplishes frequency translation through signal multiplication, typically referred to in the literature as "mixing". A circuit of this type is known as a "double-balanced mixer" or "Gilbert-type mixer" and is described in literature. Standard mixer circuits are described in the text: "Analog Integrated Circuits for Communication" by Pederson and Mayaram, 1991, Kluwer. The second frequency input signal can be applied differentially at the node where the bases of transistor Q29 and Q31 are connected and at the node where the bases of transistor Q30 and Q32 are connected. Single-ended input is also possible, with one of the nodes an AC ground.

The components in FIG. 4 having the same reference numbers as in FIG. 3 are intended to refer to similar or identical components. In addition to the four converter transistors Q1, Q2, Q3 and Q4, also shown in FIG. 4 is the switch stage of the mixer including transistors Q29, Q30, Q31 and Q32. Diode connected transistors Q26 and Q0 in combination with transistor Q10 and current source $I_5$ set the needed bias currents. The output signals are currents $I_3$, $I_4$.

In one embodiment all the transistors shown in FIG. 4 are identical. Moreover each capacitor in one embodiment has a value of 25 picoFarad and each resistor has a resistance of 1000 ohms; these values are illustrative and not limiting.

A comparison was made of the performance of the converters of FIGS. 1, 2 and FIG. 3 in accordance with the present invention. The results are shown in the following table.

| Circuit | Noise Figure at 1 GHz | Gain | P1 dB Out | O1P3 | I1P3 |
| --- | --- | --- | --- | --- | --- |
| Fig. 1 | 8.63 dB | 3.38 dB | −16.2 | −6.0 dBm | −9.3 dBm |
| Fig. 2 | 13.1 dB | 0.05 dB | 4.8 | +5.3 dBm | +5.2 dBm |
| Fig. 3 | 4.39 dB | 8.93 dB | −11.2 | −2.9 dBm | −11.8 dBm |

As the table shows, the FIG. 3 circuit has a superior noise figure and gain while its performance for the other measurements is at least acceptable. The noise figure is for an input signal at 1 GHz. Definitions for the table are:

P1 dB: power output level at 1 dB gain compression

OIP3: output third-order intercept level

IIP3: input third-order intercept level

These are typical specifications used in radio transceiver design. P1dB relates to a maximum output level as the circuit output becomes nonlinear. Intercept points refer to a theoretical signal level where the fundamental and third-order distortion products are at the same level. This is used to characterize a circuit's distortion behavior. Definitions may be found in "Radio Communications Concepts: Analog" by Carson, 1990 Wiley.

This disclosure is illustrative and not limiting; further modifications will be apparent to one skilled in the art in the light of this disclosure and are intended to fall within the scope of the offending claims.

I claim:

1. A differential converter comprising:

a first transistor, having a control terminal to which an input signal is applied directly, and having a first current handling terminal not externally connected to said control terminal;

a second transistor having a control terminal connected to said first current handling terminal of the first transistor;

a third transistor, having a control terminal to which a reference voltage is applied, and having a first current handling terminal at which a first output current is provided, and a second current handling terminal connected to the first current handling terminal of the first transistor;

a fourth transistor, having a control terminal connected to a reference voltage, a first current handling terminal at which a second output current is provided, and a second current handling terminal connected to a first current handling terminal of the second transistor; and said first current handling terminals of said third and fourth transmitters not connected to one another.

2. The converter of claim 1, wherein a second current handling terminal of each of the first and second transistors is connected to ground.

3. The converter of claim 1, wherein the control terminals of each of the third and fourth transistors are connected to the same reference voltage.

4. The converter of claim 1, wherein each of the first, second, third and fourth transistors is a bipolar transistor.

5. The converter of claim 1, further comprising a switch stage connected to the first current handling terminals of each of the third and fourth transistors.

6. The converter of claim 5, wherein the switch stage includes a fifth and a sixth transistor each having a first current handling terminal providing an output current, and a second current handling terminal connected to respectively the first current handling terminals of the third and fourth transistors.

7. A method of converting a signal amplitude to a differential signal, comprises the steps of:

applying the signal amplitude to an input terminal of a cascode amplifier; said cascode amplifier including a differential converter comprising:

a first transistor, having a control terminal forming said input terminal and applying said signal amplitude directly thereto, and having a first current handling terminal not externally connected to said control terminal;

a second transistor having a control terminal connected to said first current handling terminal of the first transistor;

a third transistor, having a control terminal to which a reference voltage is applied, and having a first current handling terminal at which a first output current is provided, and a second current handling terminal connected to the first current handling terminal of the first transistor;

a fourth transistor, having a control terminal connected to a reference voltage, a first current handling terminal at which a second output current is provided, and a second current handling terminal connected to a first current handling terminal of the second transistor; and said first current handling terminals of said third and fourth transmitters not connected to one another;

generating a signal 180° out of phase with an output signal from the cascode amplifier; and using the out of phase signal and the output signal of the cascode amplifier as two differential output signals.

* * * * *

UNITED STATES PATENT AND TRADEMARK OFFICE
CERTIFICATE OF CORRECTION

PATENT NO. : 5,929,710
DATED : July 27, 1999
INVENTOR(S) : David E. Bien

Page 1 of 1

It is certified that error appears in the above-identified patent and that said Letters Patent is hereby corrected as shown below:

Column 1,
Line 12, "Q1 and Q2" and insert -- $Q_1$ and $Q_2$ --.
Line 13, delete "Q1" and insert -- $Q_1$ --.
Line 14, delete "Q2" and insert -- $Q_2$ --.
Line 19, delete "Q1 and Q2" and insert -- $Q_1$ and $Q_2$ --.
Line 21, delete "Q1, Q2" and insert -- $Q_1$, $Q_2$ --.
Line 24, delete "Q1 and Q2" and insert -- $Q_1$ and $Q_2$ --.
Line 48, delete "Q4" and insert -- $Q_4$ --.
Line 50, delete "Q5 and Q6 with transistor Q5" and insert -- $Q_5$ and $Q_6$ with transistor $Q_5$ --.
Line 53, delete "Q4" and insert -- $Q_4$ --.
Line 53, delete "Q5" and insert -- $Q_5$ --.
Line 55, delete "Q5, Q6" and insert -- $Q_5$, $Q_6$ --.
Line 56, delete "R1 and R2" and insert -- $R_1$ and $R_2$ --.
Line 58, delete "Q4" and insert -- $Q_4$ --.
Line 60, delete "I1, I2" and insert -- $I_1$, $I_2$ --.
Line 62, delete "I1 - I2" and insert -- $I_1$ - $I_2$ --.

Column 3,
Line 9, delete "Q1, Q2" and insert -- $Q_1$, $Q_2$ --.

Signed and Sealed this

Thirtieth Day of April, 2002

*Attest:*

JAMES E. ROGAN
*Attesting Officer*  *Director of the United States Patent and Trademark Office*